United States Patent
Utsunomiya et al.

(10) Patent No.: US 6,882,245 B2
(45) Date of Patent: Apr. 19, 2005

(54) FREQUENCY DISCRETE LC FILTER BANK

(75) Inventors: Kimitake Utsunomiya, Sunnyvale, CA (US); Takatsugu Kamata, Santa Clara, CA (US)

(73) Assignee: RF Stream Corporation, Osaka (JP)

( * ) Notice: Subject to any disclaimer, the term of this patent is extended or adjusted under 35 U.S.C. 154(b) by 0 days.

(21) Appl. No.: 10/272,539

(22) Filed: Oct. 15, 2002

(65) Prior Publication Data

US 2003/0227354 A1 Dec. 11, 2003

Related U.S. Application Data

(60) Provisional application No. 60/386,644, filed on Jun. 5, 2002, and provisional application No. 60/386,471, filed on Jun. 5, 2002.

(51) Int. Cl.[7] .............................. H03H 7/01; H01P 1/15
(52) U.S. Cl. ...................................... 333/174; 333/17.1
(58) Field of Search ................................ 333/174, 175, 333/176, 101, 103, 17.1; 334/47

(56) References Cited

U.S. PATENT DOCUMENTS

| | | | | | |
|---|---|---|---|---|---|
| 1,735,742 | A | * | 11/1929 | Fetter | 333/174 |
| 2,325,174 | A | * | 7/1943 | Cooper | 334/47 |
| 2,496,177 | A | * | 1/1950 | Richards et al. | 334/47 |
| 2,801,341 | A | * | 7/1957 | Jaffe et al. | 331/176 |
| 3,509,500 | A | * | 4/1970 | McNair et al. | 334/47 |
| 3,794,941 | A | * | 2/1974 | Templin | 333/17.1 |

* cited by examiner

*Primary Examiner*—Hobert Pascal
*Assistant Examiner*—Dean Takaoka
(74) *Attorney, Agent, or Firm*—Stattler Johansen & Adeli LLP

(57) ABSTRACT

An inductive ("L")-capacitive ("C") filter bank has application for use in a television receiver. The LC filter includes inductors configured in at least one inductive ("L") bank, and capacitors configured in at least one capacitive ("C") bank. The inductors and capacitors are selectively enabled so as to configure an LC filter with at least one inductor from the L bank and at least one capacitor from the C bank. A combination of inductors and capacitors are selected through the semiconductor switches so as to maximize a Q factor for the LC filter.

7 Claims, 20 Drawing Sheets

FIGURE 5

| 1/L | N | 1 | 2 | 3 | 4 | 5 | 6 | 7 | 8 |
|---|---|---|---|---|---|---|---|---|---|
| Ind(nH) | Code=> | 00000 | 00001 | 00010 | 00011 | 00100 | 00101 | 00110 | 00111 |
| 5.7 | L5 | 0 | 0 | 0 | 0 | 0 | 0 | 0 | 0 |
| 11.4 | L4 | 0 | 0 | 0 | 0 | 0 | 0 | 0 | 0 |
| 22.8 | L3 | 0 | 0 | 0 | 0 | 1 | 1 | 1 | 1 |
| 45.6 | L2 | 0 | 0 | 1 | 1 | 0 | 0 | 1 | 1 |
| 91.2 | L1 | 0 | 1 | 0 | 1 | 0 | 1 | 0 | 1 |
| 91.2 | L0 | 1 | 1 | 1 | 1 | 1 | 1 | 1 | 1 |
|  | Total L | 91.20 | 45.60 | 30.40 | 22.80 | 18.24 | 15.20 | 13.03 | 11.40 |

FIGURE 6

| C | | | | M | 1 | 2 | 3 | 4 | 5 | 6 | 7 | 8 |
|---|---|---|---|---|---|---|---|---|---|---|---|---|
| Cap (pF) | $r_{sl}$ | $R_{MOS}$ | $r_s$ | M-1 | 0 | 1 | 2 | 3 | 4 | 5 | 6 | 7 |
| 64.6 | 0 | 1.1 | 1.8 | C4 | 0 | 0 | 0 | 0 | 0 | 0 | 0 | 0 |
| 32.8 | 0 | .88 | 2.3 | C3 | 0 | 0 | 0 | 0 | 1 | 1 | 1 | 1 |
| 17 | 0 | .66 | 2.8 | C2 | 0 | 0 | 0 | 1 | 0 | 0 | 1 | 1 |
| 9.4 | 0 | .44 | 4.2 | C1 | 0 | 1 | 1 | 0 | 0 | 1 | 0 | 1 |
| 3.7 | 0 | .0001 | 5.6 | C0 | .1 | 1 | 1 | 1 | 1 | 1 | 1 | 1 |
| Total | | | | C | 3.7 | 13.1 | 207 | 30.1 | 36.5 | 45.9 | 53.5 | 62.9 |

FIGURE 9

| C | M | 16 - 8 | 16 - 8 | 12 - 10 | 12 - 9 | 11 - 9 | 10 - 8 | 9 - 7 | 8 - 4 |
|---|---|---|---|---|---|---|---|---|---|
| Cap(pF) | (M-1) | N=1 | N=2 | N=3 | N=4 | N=5 | N=6 | N=7 | N=8 |
| 127.7 | 15 | 46.64 | 65.95 | 80.78 | 93.27 | 104.28 | 114.24 | 123.39 | 131.91 |
| 118.3 | 14 | 48.45 | 68.52 | 83.91 | 96.9 | 108.33 | 118.67 | 128.18 | 137.03 |
| 110.7 | 13 | 50.09 | 70.84 | 86.76 | 100.18 | 112.01 | 122.7 | 132.53 | 141.68 |
| 101.3 | 12 | 52.36 | 74.04 | 90.69 | 104.71 | 117.07 | 128.25 | 138.52 | 148.09 |
| 94.9 | 11 | 54.09 | 76.50 | 93.69 | 108.19 | 120.96 | 132.5 | 143.12 | 153 |
| 85.6 | 10 | 56.98 | 80.58 | 98.69 | 113.96 | 127.41 | 139.57 | 150.75 | 161.16 |
| 77.9 | 9 | 59.71 | 84.44 | 103.42 | 119.41 | 133.51 | 146.25 | 157.97 | 168.88 |
| 68.5 | 8 | 63.66 | 90.03 | 110.26 | 127.32 | 142.34 | 155.93 | 168.42 | 180.05 |
| 62.9 | 7 | 66.47 | 94.00 | 115.12 | 132.93 | 148.62 | 162.81 | 175.85 | 187.99 |
| 53.5 | 6 | 72.05 | 101.9 | 124.80 | 144.1 | 161.11 | 176.49 | 190.63 | 203.79 |
| 45.9 | 5 | 77.82 | 110.6 | 134.79 | 155.65 | 174.02 | 190.63 | 205.9 | 220.12 |
| 36.5 | 4 | 87.24 | 123.38 | 151.11 | 174.49 | 195.08 | 213.7 | 230.83 | 246.76 |
| 30.1 | 3 | 96.08 | 135.87 | 166.41 | 192.15 | 214.83 | 235.34 | 254.19 | 271.74 |
| 20.7 | 2 | 115.78 | 163.74 | 200.53 | 231.56 | 258.89 | 283.6 | 306.32 | 327.47 |
| 13.1 | 1 | 145.72 | 206.08 | 252.39 | 291.44 | 325.84 | 356.94 | 385.54 | 412.16 |
| 3.7 | 0 | 273.61 | 386.95 | 473.91 | 547.22 | 611.82 | 670.21 | 723.91 | 773.89 |

FIGURE 10

| C | | M | 16-8 | 16-8 | 12-10 | 12-9 | 11-9 | 10-8 | 9-7 | 8-4 |
|---|---|---|---|---|---|---|---|---|---|---|
| Cap(pF) | RMOS | (M-1) | N=1 | N=2 | N=3 | N=4 | N=5 | N=6 | N=7 | N=8 |
| 127.7 | 0.0 | 15 | 46.64 | 65.95 | 80.78 | 93.27 | 104.28 | 114.24 | 123.39 | 131.91 |
| 118.3 | 2.6 | 14 | 48.45 | 68.52 | 83.91 | 96.9 | 108.33 | 118.67 | 128.18 | 137.03 |
| 110.7 | 2.4 | 13 | 50.09 | 70.84 | 86.76 | 100.18 | 112.01 | 122.7 | 132.53 | 141.68 |
| 101.3 | 2.0 | 12 | 52.36 | 74.04 | 90.69 | 104.71 | 117.07 | 128.25 | 138.52 | 148.09 |
| 94.9 | 2.2 | 11 | 54.09 | 76.50 | 93.69 | 108.19 | 120.96 | 132.5 | 143.12 | 153 |
| 85.6 | 1.8 | 10 | 56.98 | 80.58 | 98.69 | 113.96 | 127.41 | 139.57 | 150.75 | 161.16 |
| 77.9 | 1.5 | 9 | 59.71 | 84.44 | 103.42 | 119.41 | 133.51 | 146.25 | 157.97 | 168.88 |
| 68.5 | 1.1 | 8 | 63.66 | 90.03 | 110.26 | 127.32 | 142.34 | 155.93 | 168.42 | 180.05 |
| 62.9 | 2.0 | 7 | 66.47 | 94.00 | 115.12 | 132.93 | 148.62 | 162.81 | 175.85 | 187.99 |
| 53.5 | 1.5 | 6 | 72.05 | 101.9 | 124.80 | 144.1 | 161.11 | 176.49 | 190.63 | 203.79 |
| 45.9 | 1.3 | 5 | 77.82 | 110.6 | 134.79 | 155.65 | 174.02 | 190.63 | 205.9 | 220.12 |
| 36.5 | .9 | 4 | 87.24 | 123.38 | 151.11 | 174.49 | 195.08 | 213.7 | 230.83 | 246.76 |
| 30.1 | 1.1 | 3 | 96.08 | 135.87 | 166.41 | 192.15 | 214.83 | 235.34 | 254.19 | 271.74 |
| 20.7 | .7 | 2 | 115.78 | 163.74 | 200.53 | 231.56 | 258.89 | 283.6 | 306.32 | 327.47 |
| 13.1 | .4 | 1 | 145.72 | 206.08 | 252.39 | 291.44 | 325.84 | 356.94 | 385.54 | 412.16 |
| 3.7 | 0 | 0 | 273.61 | 386.95 | 473.91 | 547.22 | 611.82 | 670.21 | 723.91 | 773.89 |

FIGURE 12

| C | M | 1 | 2 | 3 | 4 | 5 | 6 | 7 | 8 |
|---|---|---|---|---|---|---|---|---|---|
| Cap(pF) | Code=> (M-1) | 0 | 1 | 2 | 3 | 4 | 5 | 6 | 7 |
| 64.6 | C4 | 0 | 0 | 0 | 0 | 0 | 0 | 0 | 0 |
| 32.8 | C3 | 0 | 0 | 0 | 0 | 1 | 1 | 1 | 1 |
| 17 | C2 | 0 | 0 | 1 | 1 | 0 | 0 | 1 | 1 |
| 9.4 | C1 | 0 | 1 | 0 | 1 | 0 | 1 | 0 | 1 |
| 3.7 | C0 | 1 | 1 | 1 | 1 | 1 | 1 | 1 | 1 |
|  | Total C | 3.7 | 13.1 | 20.7 | 30.1 | 36.5 | 45.9 | 53.5 | 62.9 |

FIGURE 15a

| 1/L | N | 11-32 | 15-32 | 14-24 | 12-19 | 11-15 | 11-13 | 10-12 | 8-11 |
|---|---|---|---|---|---|---|---|---|---|
| lnd(nH) | (N-1) | M=1 | M=2 | M=3 | M=4 | M=5 | M=6 | M=7 | M=8 |
| 2.85 | 31 | 1490.62 | 860.61 | 666.63 | 563.4 | 496.87 | 449.44 | 413.42 | 384.88 |
| 2.94 | 30 | 1467.15 | 847.06 | 656.13 | 554.53 | 489.05 | 442.36 | 406.91 | 378.82 |
| 3.04 | 29 | 1443.29 | 833.28 | 645.46 | 545.51 | 481.10 | 435.17 | 400.30 | 372.66 |
| 3.1 | 28 | 1419.03 | 819.28 | 634.61 | 536.34 | 473.01 | 427.85 | 393.57 | 366.39 |
| 3.3 | 27 | 1394.35 | 805.03 | 623.57 | 527.01 | 464.78 | 420.41 | 386.72 | 360.02 |
| 3.4 | 26 | 1369.22 | 790.52 | 612.34 | 517.52 | 456.41 | 412.84 | 379.75 | 353.53 |
| 3.5 | 25 | 1343.63 | 775.74 | 600.89 | 507.84 | 447.88 | 405.12 | 372.66 | 346.92 |
| 3.6 | 24 | 1317.54 | 760.68 | 589.22 | 497.98 | 439.18 | 397.25 | 365.42 | 340.19 |
| 3.8 | 23 | 1290.92 | 745.31 | 577.32 | 487.92 | 430.31 | 389.23 | 358.04 | 333.31 |
| 4.0 | 22 | 1263.74 | 729.62 | 565.16 | 477.65 | 421.25 | 381.03 | 350.50 | 326.30 |
| 4.1 | 21 | 1235.96 | 713.58 | 552.74 | 467.15 | 411.99 | 372.66 | 342.79 | 319.12 |
| 4.3 | 20 | 1207.54 | 697.17 | 540.03 | 456.41 | 402.51 | 364.09 | 334.91 | 311.79 |
| 4.6 | 19 | 1178.44 | 680.37 | 527.01 | 445.41 | 392.81 | 355.31 | 326.84 | 304.27 |
| 4.8 | 18 | 1148.60 | 663.15 | 513.67 | 434.13 | 382.87 | 346.32 | 318.56 | 296.57 |
| 5.1 | 17 | 1117.97 | 645.46 | 499.97 | 422.55 | 372.66 | 337.08 | 310.07 | 288.66 |

| 5.4 | 16 | 1086.47 | 627.27 | 485.88 | 410.65 | 362.16 | 327.58 | 301.33 | 280.52 |
| --- | --- | --- | --- | --- | --- | --- | --- | --- | --- |
| 5.7 | 15 | 1054.03 | 608.54 | 471.38 | 398.39 | 351.34 | 317.80 | 292.34 | 272.15 |
| 6.1 | 14 | 1020.56 | 589.22 | 456.41 | 385.74 | 340.19 | 307.71 | 283.05 | 263.51 |
| 6.5 | 13 | 985.95 | 569.24 | 440.93 | 372.66 | 328.65 | 297.28 | 273.45 | 254.57 |
| 7.0 | 12 | 950.09 | 548.53 | 424.89 | 359.10 | 316.70 | 286.46 | 263.51 | 245.31 |
| 7.6 | 11 | 912.82 | 527.01 | 408.22 | 345.01 | 304.27 | 275.22 | 253.17 | 235.69 |
| 8.3 | 10 | 873.95 | 504.58 | 390.84 | 330.32 | 291.32 | 263.51 | 242.39 | 225.65 |
| 9.1 | 9 | 833.28 | 481.10 | 372.66 | 314.95 | 277.76 | 251.24 | 231.11 | 215.15 |
| 10.1 | 8 | 790.52 | 456.41 | 353.53 | 298.79 | 263.51 | 238.35 | 219.25 | 204.11 |
| 11.4 | 7 | 745.31 | 430.31 | 333.31 | 281.70 | 248.44 | 224.72 | 206.71 | 192.44 |
| 13.0 | 6 | 697.17 | 402.51 | 311.79 | 263.51 | 232.39 | 210.21 | 193.36 | 180.01 |
| 15.2 | 5 | 645.46 | 372.66 | 288.66 | 243.96 | 215.15 | 194.61 | 179.02 | 166.66 |
| 18.2 | 4 | 589.22 | 340.19 | 263.51 | 222.70 | 196.41 | 177.66 | 163.42 | 152.14 |
| 22.8 | 3 | 527.01 | 304.27 | 235.69 | 199.19 | 175.67 | 158.90 | 146.17 | 136.07 |
| 30.4 | 2 | 456.41 | 304.27 | 204.11 | 172.51 | 152.14 | 137.61 | 126.58 | 117.84 |
| 45.6 | 1 | 372.66 | 263.51 | 166.66 | 140.85 | 124.22 | 112.36 | 103.36 | 96022 |
| 91.2 | 0 | 263.51 | 215.15 | 117.84 | 99.60 | 87.84 | 79.45 | 73.08 | 68.04 |

| C | | | | M | 1 | 2 | 3 | 4 | 5 | 6 | 7 | 8 |
|---|---|---|---|---|---|---|---|---|---|---|---|---|
| Cap (pF) | $r_{sl}$ | $R_{MOS}$ | $r_s$ | M-1 | 0 | 1 | 2 | 3 | 4 | 5 | 6 | 7 |
| 64.6 | 0 | 1.1 | 1.8 | C4 | 0 | 0 | 0 | 0 | 0 | 0 | 0 | 0 |
| 32.8 | 0 | .88 | 2.3 | C3 | 0 | 0 | 0 | 0 | 1 | 1 | 1 | 1 |
| 17 | 0 | .66 | 2.8 | C2 | 0 | 0 | 0 | 1 | 0 | 0 | 1 | 1 |
| 9.4 | 0 | .44 | 4.2 | C1 | 0 | 1 | 1 | 0 | 0 | 1 | 0 | 1 |
| 3.7 | 0 | .0001 | 5.6 | C0 | 1 | 1 | 1 | 1 | 1 | 1 | 1 | 1 |
| Total | | | | C | 3.7 | 13.1 | 20.7 | 30.1 | 36.5 | 45.9 | 53.5 | 62.9 |

$$Vout = Vt \cdot \ln\left(\frac{1}{Is} \cdot \frac{Inum}{Iden}\right)$$

FREQUENCY DISCRETE LC FILTER BANK

CROSS-REFERENCES TO RELATED APPLICATIONS

This application claims the benefit of U.S. Provisional Patent Application No. 60/386,644, filed Jun. 5, 2002, entitled "Frequency Discrete L-C Tank for TV Tuner", and U.S. Provisional Patent Application No. 60/386,471, filed Jun. 5, 2002, entitled "Functional Comparator for Binary L-C bank Addressing."

BACKGROUND OF THE INVENTION

1. Field of the Invention

The present invention is directed toward the field of discrete passive filters, and more particularly toward a tunable LC filter bank.

2. Art Background

Typically, receivers employ filters to condition both input signals and internally generated reference signals. For example, bandpass, notch, and low pass are types of filters employed in receivers. The frequency response of a filter refers to the characteristics of the filter that condition the signal input to the filter. For example, a bandpass filter may attenuate an input signal across a pre-determined band of frequencies above and below a center frequency of the filter. Filters are designed to exhibit frequency responses based on one or more circuit parameters.

Some receivers are designed to process input signals with a range of input carrier frequencies (e.g., wide band receivers). For example, television receivers must be capable of processing input television signals with carrier frequencies ranging from 55 MHz to 880 MHz. One circuit parameter used to define the frequency response of a filter is the carrier frequency of an input signal. Thus, such wide band receivers require filters to generate multiple frequency responses to accommodate multiple input carrier frequencies. To accomplish this, some receivers employ tunable filters to process a wide band of input frequencies.

One type of tunable filter is a varactor type tuner. A popular application for the varactor is in electronic tuning circuits, such as television tuners. A direct current ("DC") control voltage varies the capacitance of the varactor, re-tuning a resonant circuit (i.e., filter). Specifically, a varactor diode uses a pn junction in reverse bias such that the capacitance of the diode varies with the reverse voltage. However, the relationship between the control voltage and the capacitance in a varactor tuner is not linear. Thus, the capacitance value is based on the signal level. This non-linearity produces distortion in the output of the filter (e.g., a third order product).

Other receivers, such as television receivers, may employ active filters. The use of a continuous or active filter requires a power supply voltage (e.g., $V_{cc}$). The power supply voltage exhibits a ripple due to noise on the voltage supply line. This ripple voltage, in turn, causes unacceptable frequency response characteristics on the output of the continuous amplifier. Accordingly, it is desirable to use discrete or passive filters in the receiver to isolate the signal from ripple voltage, thereby improving signal quality.

SUMMARY OF THE INVENTION

An inductive ("L")-capacitive ("C") filter bank has application for use in a television receiver. The LC filter includes a plurality of inductors configured in at least one inductive ("L") bank, and a plurality of capacitors configured in at least one capacitive ("C") bank. The inductors and capacitors are selected through use of a plurality of semiconductor switches. Specifically, the semiconductor switches are selectively enabled so as to configure an LC filter with at least one inductor from the L bank and at least one capacitor from the C bank. A combination of inductors and capacitors are selected through the semiconductor switches so as to maximize a Q factor for the LC filter.

In one embodiment, the semiconductor switches comprise metal oxide semiconductor (MOS) switches. A circuit generates an N code and an M code to selectively enable the switches for selection of at least one inductor in the L bank, and to selectively enable the switches for selection of at least one capacitor in the C bank, respectively. In one embodiment, the C bank comprises four selectable capacitors, and the L bank comprises five selectable inductors. In one embodiment, the LC filter is configured to generate a bandpass frequency response.

BRIEF DESCRIPTION OF THE DRAWINGS

FIG. 5 shows one embodiment for selecting inductors in an inductor bank from the N code.

FIG. 6 illustrates various resistances for selected inductances of the L bank.

FIG. 9 shows the information for capacitance and M code for selecting capacitors in a C Bank during VHF tuning.

FIG. 10 shows various resistances for selected capacitances of the C bank.

FIG. 12 shows one embodiment for selecting capacitors in a capacitor bank for UHF tuning.

FIGS. 15a and b show the information for selecting inductors in an L Bank during UHF tuning.

FIG. 16 illustrates various resistances for selected capacitances of the C bank.

DETAILED DESCRIPTION

The disclosures of U.S. Provisional Patent Application No. 60/386,644, filed Jun. 5, 2002, entitled "Frequency Discrete L-C Tank for TV Tuner", and U.S. Provisional Patent Application No. 60/386,471, filed Jun. 5, 2002, entitled "Functional Comparator for Binary L-C bank Addressing" are hereby expressly incorporated herein by reference.

The present invention includes one or more inductive ("L") and capacitive ("C") filter banks applied to realize a non-varactor type television tuner. In one embodiment, the television tuner is integrated into a single integrated circuit chip. The LC banks are used to implement passive filters. The television tuner optimally selects combinations of inductors and capacitors in the LC bank to tune the television receiver.

Figure 1:
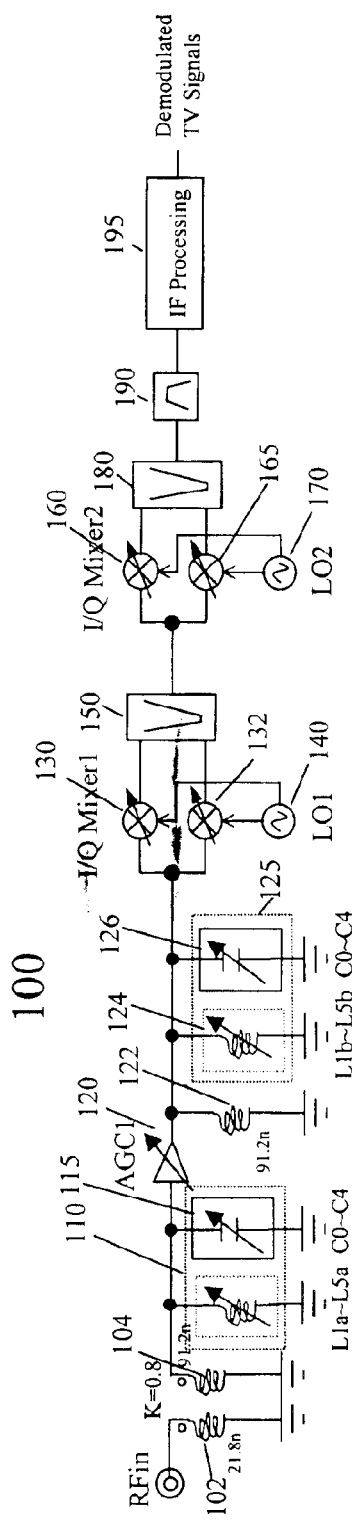
FIG. 1 is a block diagram illustrating one embodiment for a television tuner that utilizes LC bank filters.

FIG. 1 is a block diagram illustrating one embodiment for a television tuner that utilizes LC bank filters. The television tuner 100 receives a radio frequency ("RF") television signal, and generates demodulated baseband television signals (i.e., picture and sound signals). For this embodiment, television tuner 100 includes inductive banks 110 and 124, as well as capacitive banks 115 and 126. Inductive bank 110 and capacitive bank 115 comprise LC filter bank 112. Similarly, inductive bank 124 and capacitive bank 126 constitute LC filter bank 125. As described fully below, LC filter banks 110 and 115 provide a band pass filter function for television receiver 100.

The television circuit 100 also includes inductors 102 and 104 to filter the input RF signal. For this embodiment, the inductors 102 and 104 values are set to 21.8 nano henries ("nH") and 91.2 nH, respectively. An automatic gain control circuit 120 amplifies the signal, output from LC filter bank 112, for input to the second LC filter bank 125. Inductor 122, with a value of 91.2 nH, adds a parallel inductance to LC filter bank 125. As described more fully below, LC filter banks 112 and 125 generate a band pass frequency response for conditioning of the input signal.

The television tuner 100 contains one or more down conversion stages. For this embodiment, television tuner 100 includes two quadratic downconverters. A first quadratic downconverter is implemented using mixers 130 and 132, local oscillator 140, and notch filter 150. The first quadratic downconverter converts the frequency of the filtered RF television signal to a first immediate frequency (e.g., 45.75 mega hertz ("MHz")). In general, a quadratic demodulator splits the input signal, and mixes the input signal with an in-phase ("I") local oscillator signal and a quadrature phase ("Q") local oscillator signal. The Q local oscillator signal is phase shifted 90 degrees from the I local oscillator signal.

A second quadratic downconverter circuit, which receives the output signal from the first quadratic downconverter circuit, includes mixers 160 and 165, local oscillator 170, notch filter 180, and band pass filter 190. The second quadratic downconverter converts the frequency of the first intermediate television signal to a second immediate frequency (e.g., 10.5 mega hertz ("MHz")).

The television receiver also includes IF processing 195. The IF processing module 195 generates baseband picture and sound carrier components. One embodiment for IF processing that utilizes a quadratic demodulator to process a television signal is described in U.S. patent application Ser. No. 10/262,514, entitled Quadratic Nyquist Slope Filter, filed Sep. 30, 2002, which is expressly incorporated herein by reference.

Figure 2:
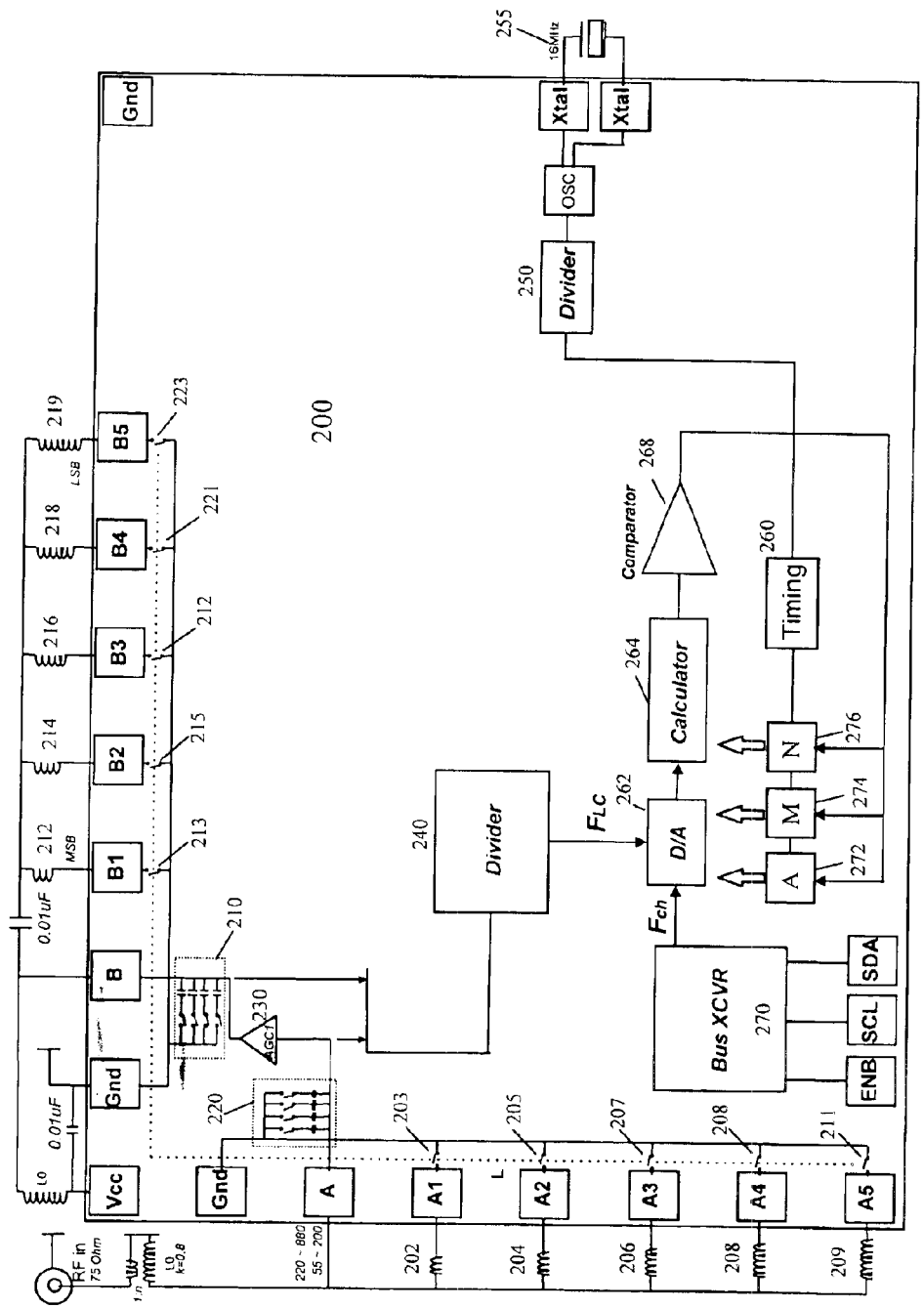
FIG. 2 is a block diagram illustrating one embodiment for implementing the LC bank filters in a television tuner.

FIG. 2 is a block diagram illustrating one embodiment for implementing the LC bank filters in a television tuner. A television receiver 200 includes inductive "L" banks A and B. For this embodiment, the L banks are implemented external to an integrated circuit 200. The L bank "A" consists of five inductors (202, 204, 206, 208, and 209). Similarly, L bank "B" contains five inductors (212, 214, 216, 218, and 219). Each inductor of inductive bank A is electrically coupled to integrated circuit 200 through an input/output ("I/O") pad (i.e., pad A1 couples conductive 202, pad A2 couples inductors 204, pad A3 couples inductive 206, pad A4 couples inductor 208, and pad A5 couples inductor 209). Similarly, an I/O pad is provided for each inductor in L bank B (i.e., pad B1 couples inductor 212, pad B2 couples inductor 214, pad B3 couples inductor 216, pad B4 couples inductor 218, and pad B5 couples inductor 219). A switch is provided for each inductor in both L banks A and B (switches 203, 205, 207, 208 and 211 for L bank A, and switches 213, 215, 217, 221 and 223 for L bank B). A total inductance is generated for each L bank by selectively coupling the external inductors to the television receiver circuit through the switches. Specifically, a digital code (hereafter referred to as the N code) is applied to the switches to select inductors in the L bank. In one embodiment, the switches are implemented using metal oxide semiconductor ("MOS") transistors.

L bank A has a corresponding capacitive ("C") bank A, labeled 220 in FIG. 2. Similarly, L bank B has a corresponding capacitive bank B, labeled 210 in FIG. 2. In one embodiment, the C bank contains four capacitors per bank. As shown in FIG. 2, C bank 220 includes a plurality of capacitors (225, 222, 224, and 227) coupled to a plurality of switches (232, 231, 229 and 228). The capacitors are selected using a code (hereafter referred to as an M code), to control the switches that couple the capacitors to the television receiver circuit.

The television receiver circuit 200 includes circuitry to select or program the LC filter banks. In general, television receiver 200 generates the M code and N code to selectively program the LC filter banks. By selecting different combinations of inductors (L bank) and capacitors (C bank), different filter characteristics (i.e., frequency responses) are realized. For the embodiment shown in FIG. 2, television receiver 200 receives information, referred to as a channel code, that specifies the desired television channel. In one embodiment, the channel code is received by bus transceiver 270, using its external pins (ENB, SCL, and SDA). A programmable divider 240 is used to digitize at least a portion of the channel code (e.g., 10 bits). The programmable divider 240 is also used to digitize an LC oscillation frequency. The LC oscillation frequency is the center frequency for a tuned cavity generated by the combination of selected inductors and capacitors from the LC banks. The LC oscillation frequency is generated using amplifier (AGC) 230. The tuning circuit for television receiver 200 includes a timing reference, and associated circuitry to generate various timing signals. An oscillator circuit, which uses a 16 MHz crystal (255), is coupled to a divider 250 to generate timing signals.

Television receiver 200 also includes a plurality of digital to analog (D/A) circuits 262 to convert digital values to analog currents. In one embodiment, the analog currents are used in a calculator 264 and a comparator circuit 268 for tuning of the LC filter banks. Register 272 stores a digital value, A. The digital values for M code and N code are stored in registers 274 and 276, respectively. As shown in FIG. 2, digital values (A, M, N and $F_{LC}$, and frequency of the channel code "$F_{ch}$") are input to D/A circuits 262. As shown in FIG. 2, the calculator 264 and comparator circuit 268 generates a value for A, the M code and the N code using the timing from timing circuit 260.

Figure 3B:
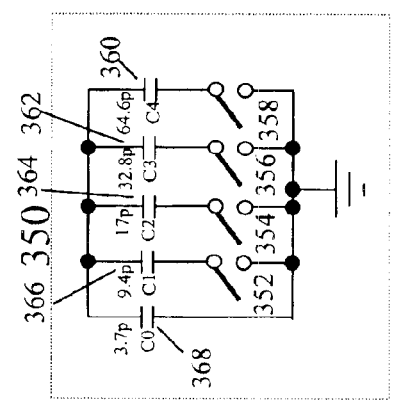
FIG. 3b illustrates one embodiment for a capacitive bank for use in the LC filter bank of the present invention.
Figure 3A:
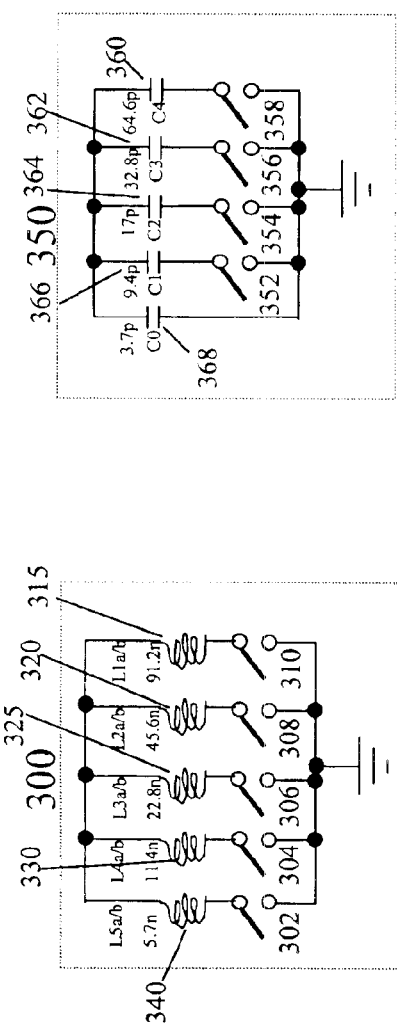
FIG. 3a illustrates one embodiment for an inductive (L) bank for use in the LC filter bank.

FIG. 3a illustrates one embodiment for an inductive (L) bank for use in the LC filter bank. For this embodiment, the inductive bank includes five inductors (315, 320, 325, 330 and 340). Although the inductive bank 300 includes five inductors, any number of inductors may be used without deviating from the spirit or scope of the invention. In one embodiment, the number and values for the inductors is a function of the desired frequency response characteristics of the LC filter bank. The inductors, which form inductive bank 300, are configured in parallel. For the embodiment of FIG. 3a, the inductor values are 5.7, 11.4, 22.8, 45.6, and 91.2 nH. Each inductor is added to the L bank through a corresponding switch (switches 310, 308, 306, 304 and 302). In one embodiment, the switches are implemented using metal oxide semiconductor ("MOS") transistors.

FIG. 3b illustrates one embodiment for a capacitive bank for use in the LC filter bank of the present invention. For this embodiment, capacitive bank 350 contains five capacitors (360, 362, 364, 366 and 368). For this embodiment, the capacitor values are 3.7, 9.4, 17, 32.8 and 64.6 pF. A different number of capacitors and different capacitive values may be selected to implement filters for the LC filter bank with different frequency responses. Also, as shown in FIG. 3b, capacitors 360, 362, 364 and 366 are selected for the C bank through switches 358, 356, 354 and 352, respectively. In one embodiment, the switches are implemented with MOS transistors.

Figure 4A:
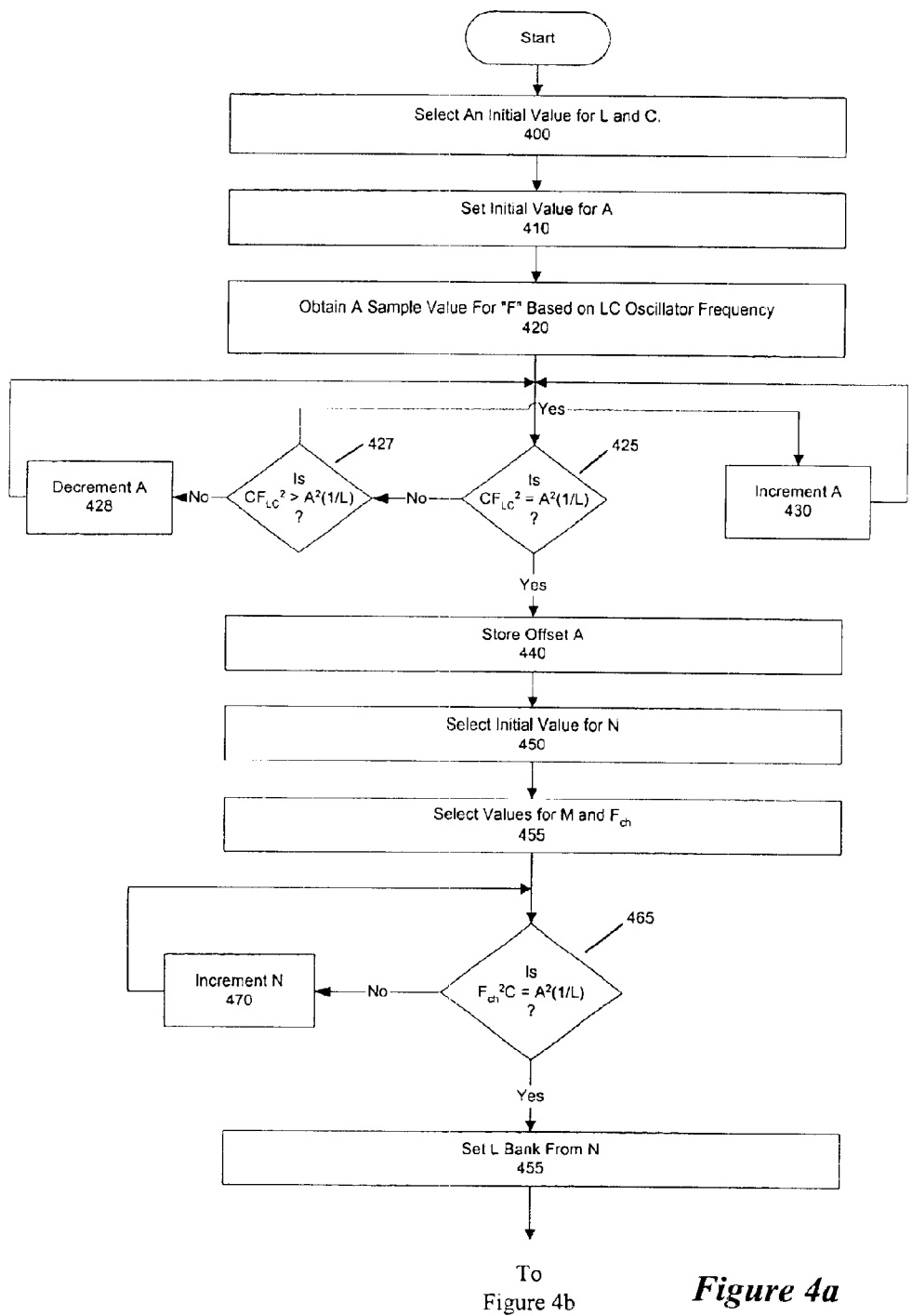
FIGS. 4a and 4b are flow diagrams illustrating one embodiment for tuning the LC filter bank for a channel in the VHF spectrum.
Figure 4B:
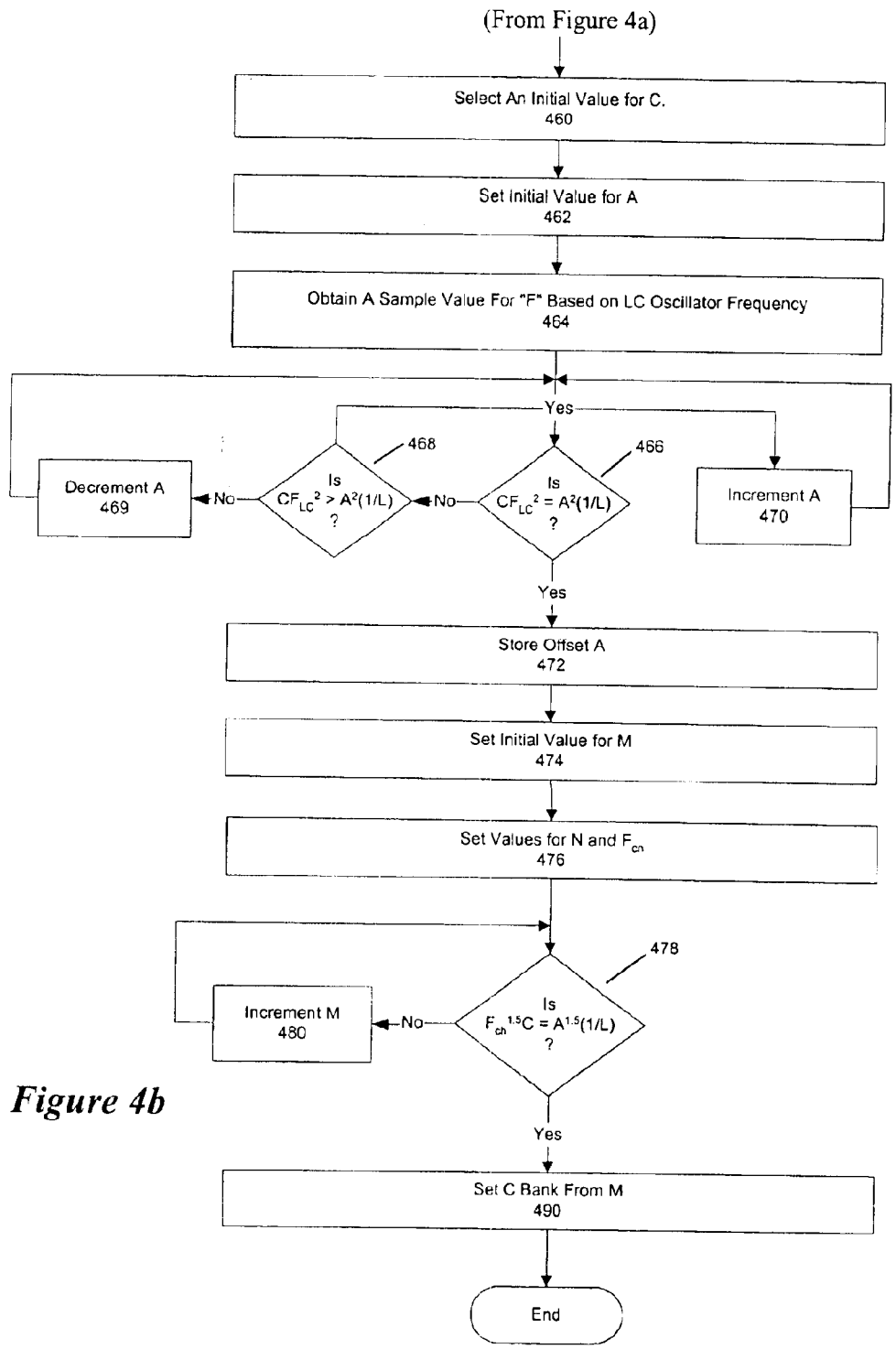

FIGS. 4a and 4b are flow diagrams illustrating one embodiment for tuning the LC filter bank for a channel in the VHF spectrum. The process is initiated by selecting an initial value for the inductance, L, (i.e., N code) and capacitance, C (i.e., M code) (block 400, FIG. 4a). In one embodiment, M is set to a value of binary 0100, and N is set to a value of binary 0001. A variable, A, is used to determine an offset between the currently tuned LC oscillator frequency, $F_{LC}$, and the desired tuned channel frequency, $F_{ch}$. In one embodiment, A comprises a five bit digital value. The variable, A, is set to an initial condition (block 410, FIG. 4). In one embodiment, the initial condition is equal to "10000."

The circuit obtains a sample value for the LC oscillator frequency ("$F_{LC}$") (block 420, FIG. 4a). The LC oscillator frequency is converted from an analog signal to a digital value using a high-speed divider. The comparator circuit (285, FIG. 2) is used to evaluate the expression:

$$CF_{LC}^2 = A^2(1/L)$$

In one embodiment, digital values for C (i.e., M code), $F_{LC}$, A, and L (i.e., N code) are converted to analog currents using a digital to analog converter, and the analog currents are input to a calculator, to generate both numeric sides of the expression, and a comparator to evaluate the expression (See FIGS. 11 & 12). If the expression is not true (i.e., $CF_{LC}^2$ does not equal $A^2(1/L)$), and $CF_{LC}^2$ is greater than $A^2(1/L)$, then the digital value for A is incremented (blocks 425, 427 and 430, FIG. 4a). For example, after the first evaluation, if $CF_{LC}^2$ is greater than $A^2(1/L)$, then the initial value of A, 10000, is incremented to the value of 10001. If the expression is not true (i.e., $CF_{LC}^2$ does not equal $A^2(1/L)$), and $CF_{LC}^2$ is less than $A^2(1/L)$, then the digital value for A is decremented (blocks 425, 427 and 428, FIG. 4a). For example, after the first evaluation, if $CF_{LC}^2$ is less than $A^2(1/L)$, then the initial value of A, 10000, is decremented to the value of 01111. This process repeats until the expression evaluates to true. When the expression evaluates to true, the offset, A, has been calculated. The offset is stored in a register for subsequent use (block 440, FIG. 4a).

To tune the input VHF channel, a value for the N code is first determined. The selection of N (inductive selection) results in coarse tuning a channel in the VHF spectrum. The circuit sets an initial value for the N code (block 450, FIG. 4a). In one embodiment, N is set to a value of 00001. Also, values are selected for M and $F_{ch}$ (block 455, FIG. 4a). In one embodiment, the M code is set to a value of 0100, and $F_{ch}$ is set to the value of the channel code (i.e., the desired tuned frequency).

A circuit evaluates the expression:

$$CF_{ch}^2 = A^2(1/L).$$

In one embodiment, digital values for C (i.e., M code), $F_{ch}$, A, and L (i.e., N code) are converted for evaluation of the expression. If the expression is not true (i.e., $CF_{ch}^2$ does not equal $A^2(1/L)$), then the digital value for N is incremented (blocks 465 and 470, FIG. 4a). For example, after the first evaluation, if $CF_{LC}^2$ is not equal to $A^2(1/L)$, then the initial value of N, 00001, is incremented to the value of 00010. This process repeats until the expression evaluates to true. When the expression evaluates to true, the N code has been determined, and the L bank is set based on the N code (block 455, FIG. 4a).

The process re-calculates the offset, A, after the course tuning procedure. The variable, A, is set to an initial condition (e.g., 10000) (block 462, FIG. 4b). The circuit obtains a new sample value for the LC oscillator frequency, $F_{LC}$, after the course tuning (block 464, FIG. 4b). The frequency, $F_{LC}$, is converted from an analog signal to a digital value using a high-speed divider. The following expression is evaluated:

$$CF_{LC}^2 = A^2(1/L)$$

If the expression is not true (i.e., $CF_{LC}^2$ does not equal $A^2(1/L)$), and $CF_{LC}^2$ is greater than $A^2(1/L)$, then the digital value for A is incremented (blocks 466, 468 and 470, FIG. 4b). If the expression is not true (i.e., $CF_{LC}^2$ does not equal $A^2(1/L)$), and $CF_{LC}^2$ is less than $A^2(1/L)$, then the digital value for A is decremented (blocks 466, 468 and 469, FIG. 4b). This process repeats until the expression evaluates to true. When the expression evaluates to true, the new offset, A, has been calculated. The offset is stored in a register for subsequent use (block 472, FIG. 4b).

Next, a value for the M code, and consequently C, is determined. The selection of M results in fine tuning a channel in the VHF spectrum. First, an initial value is set for M (block 474, FIG. 4b). In one embodiment, M is initially set to a value of 0000. Also, the values for $F_{ch}$ and N code are selected. $F_{ch}$ represents the frequency of the channel code. The N code was set from the coarse tuning stage. The expression, $F_{ch}^{1.5}C = A^{15}(1/L)$, is evaluated to determine if it is true (block 478, FIG. 4b). In one embodiment, these digital values are converted to analog current values using digital to analog converters. The analog current values are then weighted in accordance with the expression (e.g., $A^{1.5}$, $F_{ch}^{1.5}$, etc.) using a calculator, and then compared using a comparator (See FIGS. 11 and 12). If the expression does not evaluate to true, the M code is incremented (block 480, FIG. 4b), and the expression is again evaluated with the new M code. This process is repeated until the expression evaluates to true. With the expression evaluates to true, the capacitive bank is set based on the M code (block 490, FIG. 4b).

FIG. 5 shows one embodiment for selecting inductors in an inductor bank from the N code. The first column of FIG. 5 shows inductor values for the corresponding inductors in the inductor bank shown in column 2. For example, inductor L5 has a value of 5.7 nH, while inductor L1 has a value of 91.2 nH. Note that inductor L0 is always selected. A binary N code for selecting inductors in the inductor bank is shown. For example, column 3 shows selection of inductor L0 for the N code of 00000. The last column of FIG. 5 shows selection of inductors from the inductor bank for the N code of 00111. Specifically, the "00111" N code specifies selection of inductors L0, L1, L2 and L3 from the inductor bank. The last row of FIG. 5 shows the total inductance for the corresponding N code. For example, for the "00000" N code, the total inductance of the inductance bank is equal to 91.2 nH. The total inductance for the "00111" N code is equal to 11.4 nH.

The inductors and capacitors are selected from the C and L banks, respectively, the use of switches (e.g., MOS transistors). A resistance is introduced into the LC bank filter response by each transistor. Thus, each capacitor selected in the C bank increases the series resistance. The increase in series resistance, or decrease in parallel resistance, decreases the Q factor, which, in turn, degrades performance of the LC bank filter.

In general, a Q factor is measured based on the expression:

$$Q = 2\pi f RC$$

In one embodiment, the receiver selects a combination of inductors and capacitors to configure an LC filter bank so as to maximize the Q factor. As shown by the above expression, the larger the parallel resistance and capacitance, the greater the Q factor. It is an objective to maximize the Q factor through proper selection of inductance and capacitance combinations from the LC banks.

FIG. 6 illustrates various resistances for selected inductances of the L bank. Specifically, column two lists a resistance, $r_{sl}$, from the corresponding inductor. For example, L5 has a resistance of 0.7 ohms. The third column lists the resistance, $R_{MOS}$, from the MOS transistor for the corresponding inductor. For example, L4 has a $R_{MOS}$ resistance of 1.6 ohms. The fourth column lists the total series resistance, $r_s$, from selecting the corresponding inductor. For example, L3 has a total series resistance, $r_s$, of 2.8 ohms. The last row of FIG. 6 lists the total series resistance for the corresponding N code. For example, an N code of 00010 has a total series resistance of 2.4 ohms. The circuit selects combinations of the inductors from an L bank to reduce the total series resistance and thus maximize the Q factor.

Figure 7:
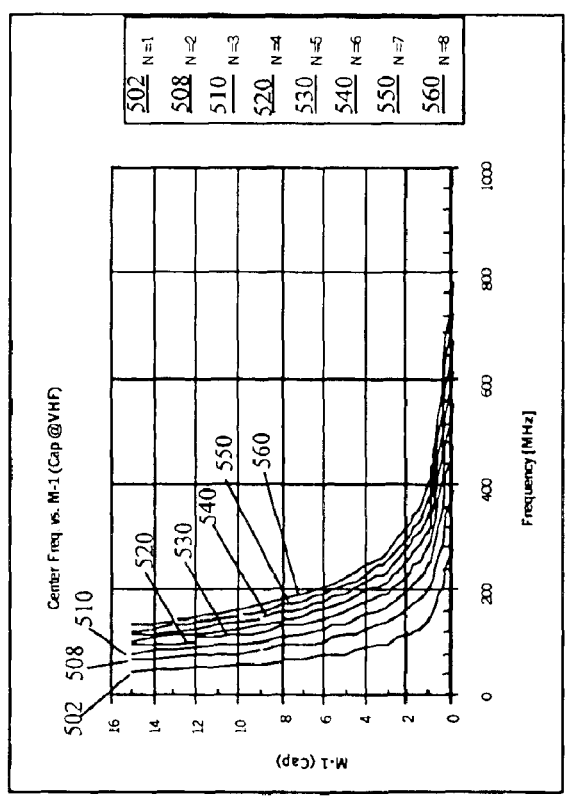
FIG. 7 is a graph that depicts the relationship between the center frequency of an LC bank filter and the total capacitance as a function of the M code.

FIG. 7 is a graph that depicts the relationship between the center frequency of an LC bank filter and the total capacitance as a function of the M code. As shown in FIG. 7, for center frequencies in the VHF spectrum, a higher M code (i.e., overall capacitance) yields a higher frequency. FIG. 7 also depicts the relationship between the M code and center frequency of the LC bank filter (and the desired channel) for each value of the N code.

Figure 8:
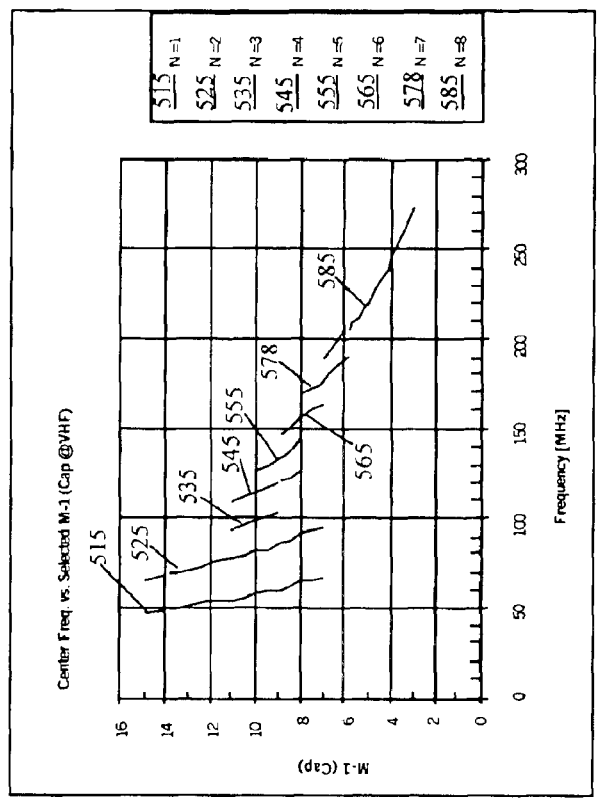
FIG. 8 depicts relationships between the selected M code and center frequency for various combinations of the N code.

In order to maximize the Q factor, only certain combinations of the N code and M code are used. FIG. 8 depicts relationships between the selected M code and center frequency for various combinations of the N code. Note that the relationship between the center LC bank filter frequency and the M code is now confined to the center of a graph. This relationship maximizes the Q factor, and optimizes the response of the LC filter bank.

As discussed above, the tuning circuit of the present invention only selects certain combinations of N and M codes to configure the LC bank filter. FIG. 9 shows the information for capacitance and M code for selecting capacitors in a C Bank during VHF tuning. The first column of FIG. 9 lists the total capacitance, which ranges from 3.7 pF to 127.7 pF, for the C bank. The second column identifies an M code to obtain the corresponding capacitance value in column one. For example, a decimal M code of 12 yields a total capacitance of 101.3 pF. Column 3 of FIG. 9 shows valid selections for the M code based on the frequency and the value of the N code. For example, in column 3, a list of frequencies is shown for valid selections of the M code when the N code is equal to 1. Specifically, column 3 shows that for these frequencies and N code, the M code has a valid range between 8 and 16 (decimal).

FIG. 10 shows various resistances for selected capacitances of the C bank. Column two lists a resistance, $R_{MOS}$, for a corresponding capacitor. For example, M code 10 (decimal) has a resistance of 1.8 ohms. The circuit selects combinations of the capacitors from a C bank to reduce the total series resistance and thus maximize the Q factor.

Figure 11A:
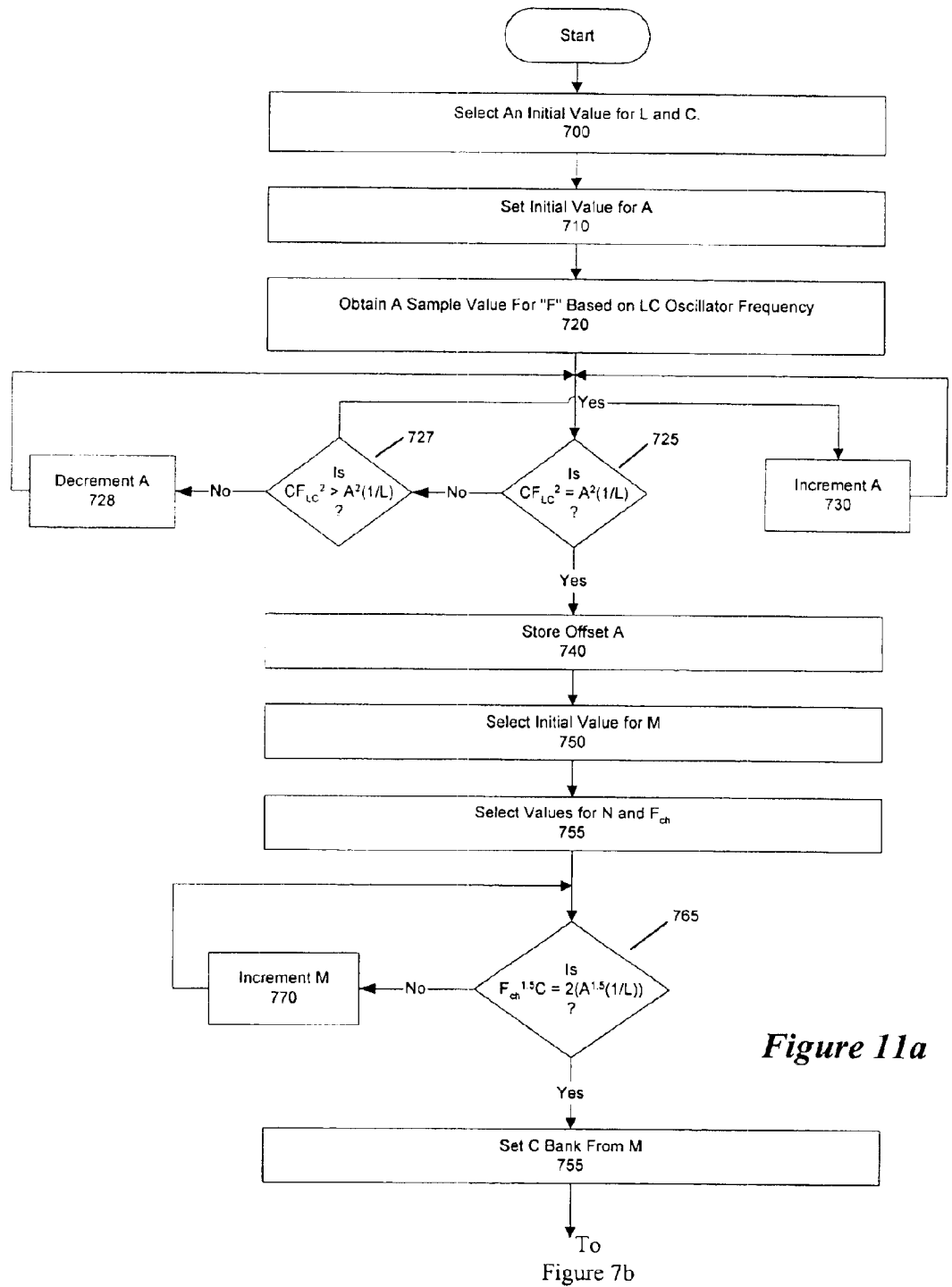
FIGS. 11a and 11b are flow diagrams illustrating one embodiment for tuning the LC filter bank for a channel in the UHF spectrum.
Figure 11B:
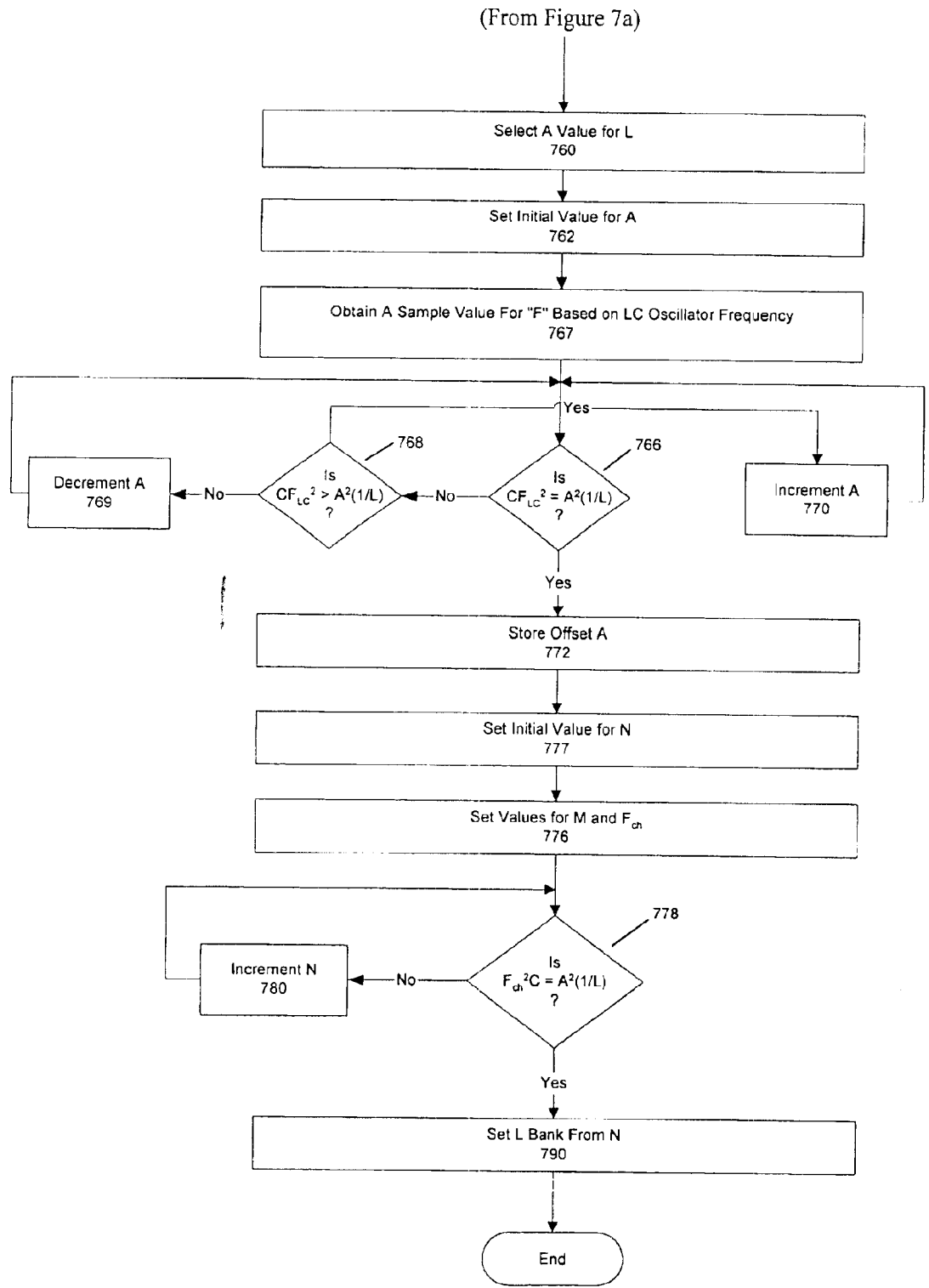

FIGS. 11a and 11b are flow diagrams illustrating one embodiment for tuning the LC filter bank for a channel in the UHF spectrum. The process is initiated by selecting an initial value for the inductance, L, (i.e., N code) and capacitance, C (i.e., M code) (block 700, FIG. 11a). In one embodiment, M is set to a value of binary 0001, and N is set to a value of binary 10000. The variable, A, is set to an initial condition (block 710, FIG. 11a). In one embodiment, the initial condition is equal to "10000."

The circuit obtains a sample value for the LC oscillator frequency ("FLC") (block 720, FIG. 11a). The LC oscillator frequency is converted from an analog signal to a digital value using a high-speed divider. The following expression is evaluated:

$$CF_{LC}^2 = A^2(1/L).$$

If the expression is not true (i.e., $CF_{LC}^2$ does not equal $A^2(1/L)$), and $CF_{LC}^2$ is greater than $A^2(1/L)$, then the digital value for A is incremented (blocks 725, 727 and 730, FIG. 11a). For example, after the first evaluation, if $CF_{LC}^2$ is greater than $A^2(1/L)$, then the initial value of A, 10000, is incremented to the value of 10001. If the expression is not true (i.e., $CF_{LC}^2$ does not equal $A^2(1/L)$), and $CF_{LC}^2$ is less than $A^2(1/L)$, then the digital value for A is decremented (blocks 725, 727 and 728, FIG. 11a). For example, after the first evaluation, if $CF_{LC}^2$ is less than $A^2(1/L)$, then the initial value of A, 10000, is decremented to the value of 01111. This process repeats until the expression evaluates to true. When the expression evaluates to true, the offset, A, has been calculated. The offset is stored in a register for subsequent use (block 740, FIG. 11a).

To tune the input UHF channel, a value for the M code is first determined. The selection of M (capacitive selection) results in coarse tuning a channel in the UHF spectrum. The circuit sets an initial value for the M code (block 750, FIG. 11a). In one embodiment, M is set to a value of 00001. Also, values are selected for N and $F_{ch}$ (block 755, FIG. 1a). The N code is set to a value of 10000, and $F_{ch}$ is set to the value of the channel code (i.e., the desired tuned frequency).

A circuit evaluates the expression:

$$CF_{ch}^{1.5} = 2(A^{1.5}(1/L)).$$

If the expression is not true (i.e., $CF_{ch}^{1.5}$ does not equal $2(A^{1.5}(1/L))$), then the digital value for M is incremented (blocks 765 and 770, FIG. 11a). For example, after the first evaluation, if $CF_{ch}^{1.5}$ is not equal to $2(A^{1.5}(1/L))$ then the initial value of M, 00001, is incremented to the value of 00010. This process repeats until the expression evaluates to true. When the expression evaluates to true, the M code has been determined, and the C bank is set based on the M code (block 755, FIG. 11a).

The process re-calculates the offset, A, after the course tuning procedure. The variable, A, is set to an initial condition (e.g., 10000) (block 762, FIG. 11b). The circuit obtains a new sample value for the LC oscillator frequency, $F_{LC}$, after the course tuning (block 764, FIG. 11b). The frequency, $F_{LC}$, is converted from an analog signal to a digital value using a high-speed divider. The following expression is evaluated:

$$CF_{LC}^2 = A^2(1/L)$$

If the expression is not true (i.e., $CF_{LC}^2$ does not equal $A^2(1/L)$), and $CF_{LC}^2$ is greater than $A^2(1/L)$, then the digital value for A is incremented (blocks 766, 768 and 770, FIG. 11b). If the expression is not true (i.e., $CF_{LC}^2$ does not equal $A^2(1/L)$), and $CF_{LC}^2$ is less than $A^2(1/L)$, then the digital value for A is decremented (blocks 766, 768 and 769, FIG. 11b). This process repeats until the expression evaluates to true. When the expression evaluates to true, the new offset, A, has been calculated. The offset is stored in a register for subsequent use (block 772, FIG. 11b).

Next, a value for the N code, and consequently L, is determined. The selection of the N code results in fine tuning a channel in the UHF spectrum. First, an initial value is set for N (block 774, FIG. 11b). In one embodiment, N is initially set to a value of 0000. Also, the values for $F_{ch}$ and M code are selected. $F_{ch}$ represents the frequency of the channel code. The M code was set from the coarse tuning stage. The expression, $F_{ch}^{2.0} C = A^{2.0}(1/L)$, is evaluated to determine if it is true (block 778, FIG. 11b). In one embodiment, these digital values are converted to analog current values using digital to analog converters. The analog current values are then weighted in accordance with the expression (e.g., $A^{2.0}$, $F_{ch}^{2.0}$, etc.) using a calculator, and then compared using a comparator (See FIGS. 11 and 12). If the expression does not evaluate to true, the N code is incremented (block 780, FIG. 11b), and the expression is again evaluated with the new N code. This process is repeated until the expression evaluates to true. With the expression evaluates to true, the inductive bank is set based on the N code (block 790, FIG. 11b).

FIG. 12 shows one embodiment for selecting capacitors in a capacitor bank for UHF tuning. The first column of FIG. 12 shows capacitor values for the corresponding capacitors listed in column 2. For example, capacitor C3 has a value of 32.8 pF, while capacitor C1 has a value of 9.4 pF. Note that capacitor C0 is always selected. A binary M-1 code for selecting capacitors in a capacitor bank is shown. For example, column 3 shows selection of capacitor C0 for the M-1 code of 00001. The last column of FIG. 12 shows selection of capacitors from the capacitor bank for the M-1 code of 01111. Specifically, the "01111" M-1 code specifies selection of capacitors C0, C1, C2 and C3 from the capacitor bank. The last row of FIG. 12 shows the total capacitance for the various M-1 codes. For example, for the "00001" M-1 code, the total capacitance of the capacitor bank is equal to 3.7 pF. The total capacitance for the "01111" M-1 code is equal to 62.9 pF.

Figure 13:
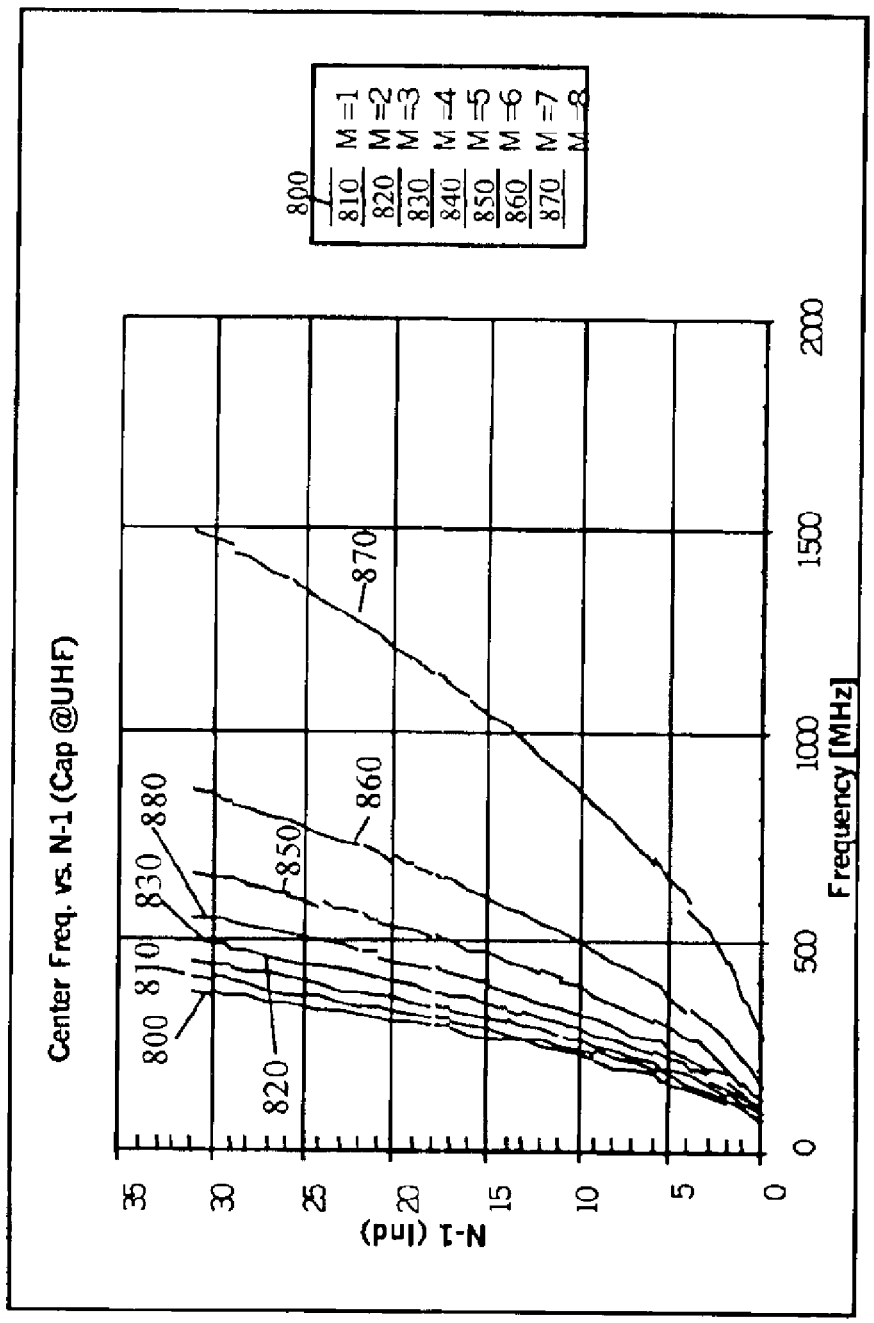
FIG. 13 is a graph that depicts the relationship between the center frequency of an LC bank filter and the total inductance as a function of the N-1 code.

FIG. 13 is a graph that depicts the relationship between the center frequency of an LC bank filter and the total inductance as a function of the N-1 code. As shown in FIG. 13, for center frequencies in the UHF spectrum, a lower N-1 code (i.e., overall inductance) yields a higher center frequency. FIG. 13 also depicts the relationship between the N-1 code and center frequency of the LC bank filter (and the desired channel) for each value of the M code. For example, curve 870 shows the relationship between the center frequency of an LC bank filter and the total inductance as a function of the N-1 code when M is equal to 7.

Figure 14:
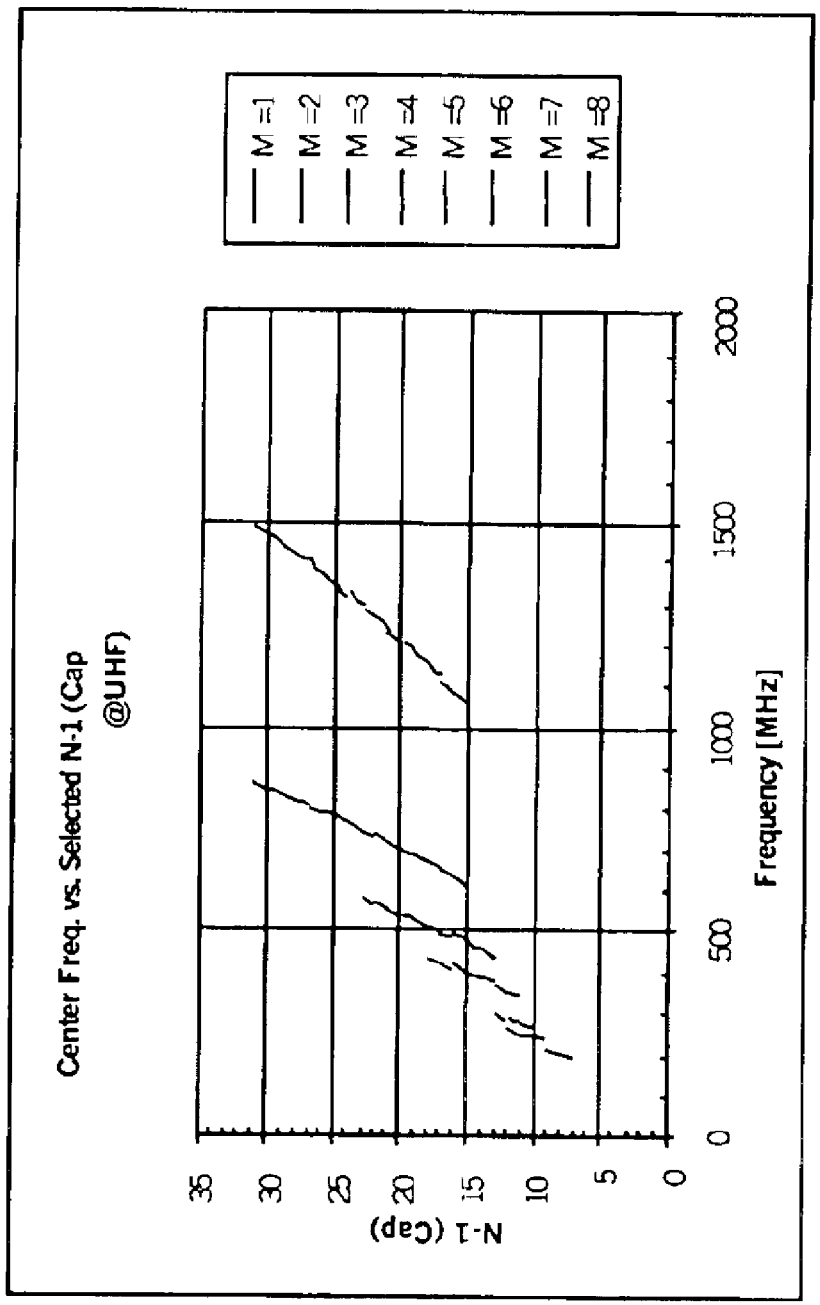
FIG. 14 depicts relationships between the selected N-1 code and center frequency for various combinations of the M code.

As discussed above, in order to maximize the Q factor, only certain combinations of the N code and M code are used. FIG. 14 depicts relationships between the selected N-1 code and center frequency for various combination of the M code. Note that the relationship between the center LC bank filter frequency and the N-1 code is now confined to the center of a graph. This relationship minimizes the Q factor, and optimizes the response of the LC filter bank.

FIGS. 15a and b show the information for selecting inductors in an L Bank during UHF tuning. The first column of FIGS. 15a and b lists the total inductance, which ranges from 2.85 nH to 91.2 nH, for the L bank. The second column identifies an N-1 code to obtain the corresponding inductance values of column one. For example, a decimal N-1 code of 27 yields a total inductance of 3.3 nH. Column 3 of FIGS. 15a and b shows valid selections for the N-1 code based on the frequency and the value of the M code. For example, in column 3, a list of frequencies is shown for valid selections of the N-1 code when the M code is equal to 1. Specifically, column 3 shows that for these frequencies and N-1 code, the M code has a valid range between 11 and 32 (decimal).

FIG. 16 illustrates various resistances for selected capacitances of the C bank. The third column of FIG. 16 lists the resistance, $R_{MOS}$, from the MOS transistor for the corresponding capacitor. For example, C2 has a $R_{MOS}$ resistance of 0.66 ohms. The fourth column lists the total series resistance, $r_s$, from selecting the corresponding capacitor. For example, C4 has a total series resistance, $r_s$, of 1.8 ohms. The circuit selects combinations of capacitors from a C bank to reduce the total series resistance and thus maximize the Q factor.

Figure 17:
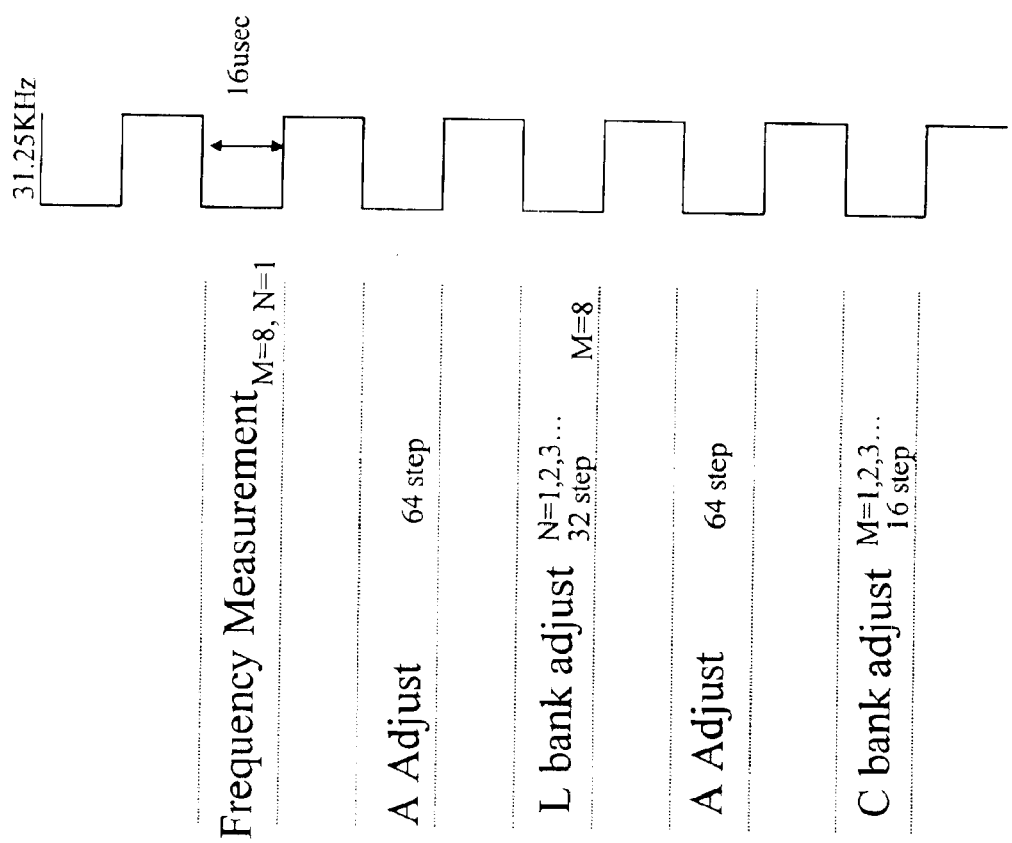
FIG. 17 is a timing diagram that shows timing for tuning the LC filter bank in accordance with one embodiment.

FIG. 17 is a timing diagram that shows timing for tuning the LC filter bank in accordance with one embodiment. As shown in FIG. 17, there are five operations to tune the LC filter bank for a channel in the VHF spectrum. For this embodiment, a timing signal has a frequency of 31.25 kHz. First, a frequency measurement of the LC oscillator frequency is made. As shown in FIG. 17, the LC oscillator frequency measurement occurs in a single 16 micro second cycle. As described in FIG. 4a, an offset, A, which indicates the difference between the LC oscillator frequency and the desired frequency, is calculated. The process to calculate the offset, an iterative process, occurs over sixty-four (64) steps (i.e., the value for A is determined in a loop that consists of no more than 64 iterations). As shown in FIG. 17, each step occurs within 16 microseconds.

When tuning the circuit for a desired channel in the VHF spectrum, inductors for the inductor bank are selected first. In one embodiment, the process to select the N code occurs in no more than 32 steps. Again, each step occurs within a 16 micro second cycle.

After inductors for the L bank are selected, a new offset, A, based on the selected inductor bank, is calculated (see FIG. 4b). As shown in FIG. 17, calculation of the new offset, A, occurs within no more than 64 steps.

The fifth operation shown in FIG. 17 selects capacitors from the C. bank. As shown in FIG. 17, the process to select the M code occurs in no more than 16 steps, with each step having a period of 16 micro seconds. As discussed above in conjunction with FIGS. 11a and 11b, tuning for channels in the UHF spectrum involves selecting the M code (tuning the capacitor bank) and then selecting the N code (tuning the inductor bank).

Figure 18:
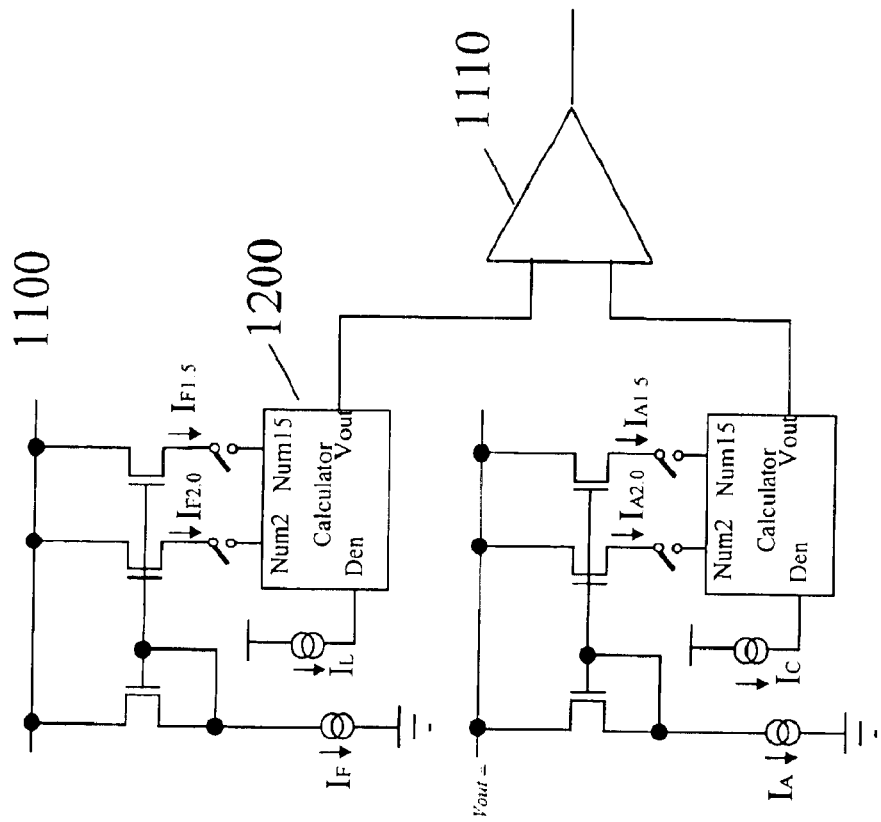
FIG. 18 illustrates one embodiment for a functional comparator circuit used in one embodiment for tuning the LC filter bank.

FIG. 18 illustrates one embodiment for a functional comparator circuit used in one embodiment for tuning the LC filter bank. A comparator circuit 1100 is used to evaluate expressions. In general, functional comparator circuit 1100 calculates expressions using analog currents. Specifically, for this embodiment, functional comparator circuit 1100 evaluates the expressions:

$$CF_{LC}^2 = A^2(1/L) \quad (1)$$

$$CF_{ch}^2 = A^2(1/L) \quad (2)$$

$$CF_{ch}^{1.5} = 2(A^{1.5}(1/L)) \quad (3)$$

$$F_{ch}^{1.5}C = A^{1.5}(1/L) \quad (4)$$

The above expressions may also be written as:

$$C/A^2 = (1/L)/F_{LC}^2 \quad (1)$$

$$C/A^2 = (1/L)/F_{ch}^2 \quad (2)$$

$$C/2A^{1.5} = (1/L)/F_{ch}^{1.5} \quad (3)$$

$$C/A^{1.5} = (1/L)/F_{ch}^{1.5} \quad (4)$$

The left-hand side of the above expressions (i.e., $C/A^2$, $C/2A^{1.5}$, and $C/A^{1.5}$) are generated using transistors 1112, 1114, and 1118, switches 1120 and 1122, current sources 1130 and 1140 and calculator 1200. Switches 1120 and 1122 are set to select either the 1.5 or 2.0 exponent for the offset variable, A. For example, to evaluate the expression $C/A^{1.5}$, switch 1120 is set to couple the current, $I_{1.5}$, for input to calculator 1200.

In one embodiment, current source 1130 is coupled to a digital to analog converter to convert the digital M code value to an analog current, $I_C$. The analog current, $I_C$, represent the capacitance and the C bank. The current sources 1140, also coupled to a digital to analog converter, converts the digital offset value, A, to an analog current, $I_A$. The output of calculator 1200, $V_{out}$, is input to comparator 1110. The $V_{out}$ voltage represents a value for the left-hand expression.

The right hand side of the above expressions (i.e., $(1/L)/F_{ch}^{1.5}$, $(1/L)/F_{LC}^2$, and $(1/L)/F_{ch1.5}$) are generated using transistors 1102, 1104, and 1106, switches a 1108 and 1110, and current sources 1109 and 1111. Switches 1108 and 1110 are used to select the appropriate exponent for the frequency. For example, if the current expression for evaluation is $(1/L)/F_{LC}^2$, then switch 1110 is set. The current source 1111 generates an analog current proportional to the inductor value for the L bank. In one embodiment, the current source 1111 is coupled to an output from a digital to analog converter that converts the digital value of the N code to an analog current. The current source 1109, also coupled to a digital to analog converter, converts the frequency (LC oscillator frequency or channel code frequency) to an analog current. The output of calculator 1200 generates a voltage, $V_{out}$, for the right hand expression.

The left-hand expression and right hand expression are input to comparator 1110. The comparator 1110 compares the $V_{out}$, generated by the left-hand side of the expression, with the $V_{out}$ generated by the right hand side of the expression.

Figure 19:
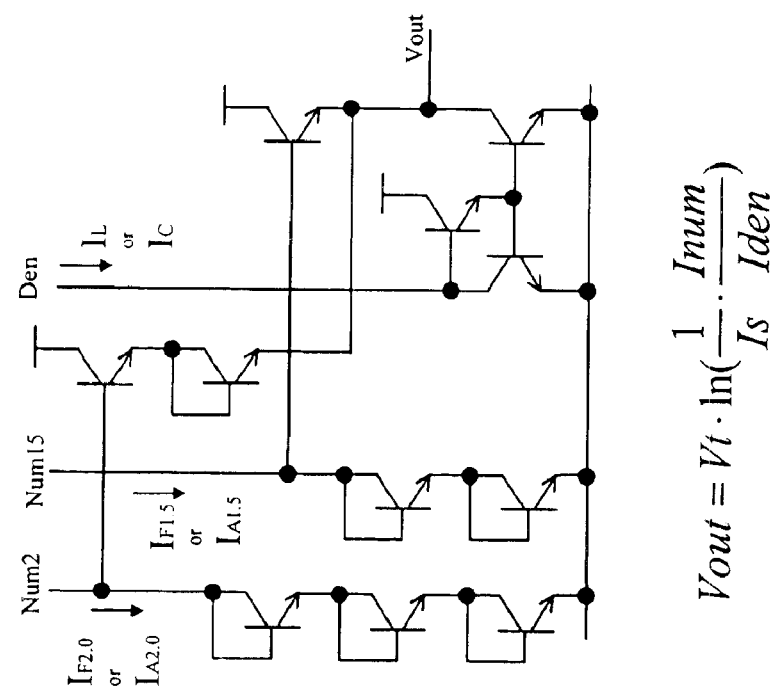
FIG. 19 illustrates one embodiment for a calculator used in the functional comparator circuit of FIG. 18.

FIG. 19 illustrates one embodiment for a calculator used in the functional comparator circuit of FIG. 18. The calculator circuit receives, as inputs, the weighted currents for frequency or offset, as well as the analog currents for inductance or capacitance. As shown in FIG. 19, the weighted currents for frequency or offset, A, with an exponent of two is input to transistors 1204, 1206, and 1210. The weighted currents for frequency or offset, A, with an exponent of 1.5 are input to transistors 1212 and 1222. The analog current for inductance or capacitance is input to the base of bipolar transistor 1224. In turn, comparator circuit generates a voltage in accordance with the following expression:

$$Vout = Vt \ln\left(\frac{1}{Is} \frac{Inum}{Iden}\right)$$

Figure 20:
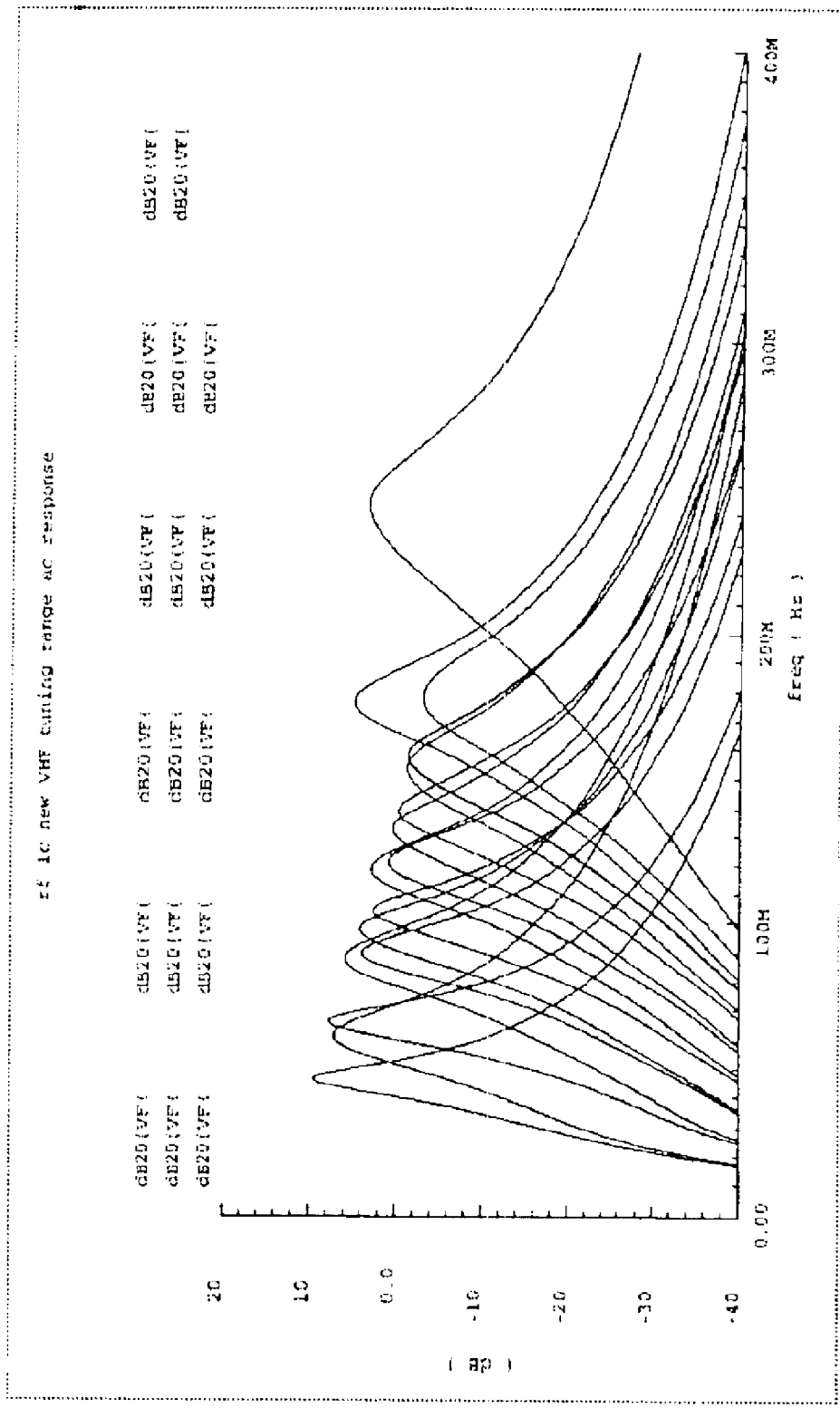
FIG. 20 illustrates a plurality of frequency responses for one embodiment of the LC filter bank.

FIG. 20 illustrates a plurality of frequency responses for one embodiment of the LC filter bank. As shown in FIG. 20, the LC filter bank, through selection of different inductors and capacitors, generates a wide range of frequency responses. The LC filter bank is a tunable filter that may be used in circuits that operate on a wide range of frequencies, such as a television receiver.

The LC filter banks filters (i.e., discrete passive filters) enhance the performance of the tuner circuit. The use of a continuous or active filter requires a power supply voltage (e.g., $V_{cc}$). The power supply voltage exhibits a ripple due to noise on the voltage supply line. This ripple voltage, in turn, causes unacceptable frequency response characteristics on the output of the continuous amplifier. Thus, the use of the discrete or passive filters in the receiver isolate the signal from ripple voltage, thereby improving signal quality.

Although the present invention has been described in terms of specific exemplary embodiments, it will be appreciated that various modifications and alterations might be made by those skilled in the art without departing from the spirit and scope of the invention.

What is claimed is:

1. A television receiver comprising:
   down conversion circuit for tuning an input television signal;
   at least one tunable inductive ("L")-capacitive ("C") filter in said down conversion circuit, said tunable LC filter comprising:
      said at least one inductive ("L") bank a plurality of inductors;
      at least one capacitive ("C") bank comprising a plurality of capacitors; and
      a plurality of semiconductor switches, coupled to said L bank and said C bank, said semiconductor switches selectively enabled so as to configure an LC filter comprising at least one inductor from said L bank and at least one capacitor from said C bank, said semiconductor switches enabled to configure said LC filter comprising a pre-determined resistance, so as to maximize a Q factor for said LC filter.

2. The television receiver as set forth in claim 1, wherein said semiconductor switches comprise metal oxide semiconductor (MOS) switches.

3. The television receiver as set forth in claim 1, further comprising a circuit for generating an N code for selectively enabling said switches to select at least one inductor in said L bank based on said N code.

4. The television receiver as set forth in claim 1, further comprising a circuit for generating an M code for selectively enabling said switches to select at least one capacitor in said C bank based on said M code.

5. The television receiver as set forth in claim 1, wherein said LC filter is configured to generate a bandpass frequency response.

6. The television receiver as set forth in claim 1, wherein said C bank comprises four selectable capacitors.

7. The television receiver as set forth in claim 1, wherein said L bank comprises five selectable inductors.

\* \* \* \* \*